US008861921B2

(12) United States Patent
Carroll

(10) Patent No.: US 8,861,921 B2
(45) Date of Patent: Oct. 14, 2014

(54) PHOTOVOLTAIC DEVICE WITH FREQUENCY CONVERSION REGION

(75) Inventor: David Loren Carroll, Winston-Salem, NC (US)

(73) Assignee: Wake Forest University, Winston-Salem, NC (US)

(*) Notice: Subject to any disclaimer, the term of this patent is extended or adjusted under 35 U.S.C. 154(b) by 254 days.

(21) Appl. No.: 13/377,048

(22) PCT Filed: Jun. 8, 2010

(86) PCT No.: PCT/US2010/037757
§ 371 (c)(1),
(2), (4) Date: Feb. 6, 2012

(87) PCT Pub. No.: WO2010/144438
PCT Pub. Date: Dec. 16, 2010

(65) Prior Publication Data
US 2012/0134618 A1    May 31, 2012

Related U.S. Application Data

(60) Provisional application No. 61/185,102, filed on Jun. 8, 2009.

(51) Int. Cl.
*G02F 1/025* (2006.01)
*H01L 51/44* (2006.01)
*H01L 27/30* (2006.01)
*H01L 51/00* (2006.01)
*H01L 51/42* (2006.01)
*G02F 1/035* (2006.01)
*G02F 1/225* (2006.01)
*B82Y 10/00* (2011.01)
*G02F 1/01* (2006.01)

(52) U.S. Cl.
CPC ........... *H01L 27/301* (2013.01); *H01L 51/0036* (2013.01); *H01L 51/4253* (2013.01); *G02F 1/035* (2013.01); *G02F 1/225* (2013.01); *Y02E 10/549* (2013.01); *H01L 51/447* (2013.01); *H01L 51/0047* (2013.01); *B82Y 10/00* (2013.01); *H01L 51/0037* (2013.01); *G02F 1/025* (2013.01); *G02F 1/011* (2013.01); *G02F 1/2255* (2013.01)
USPC ................................. 385/145; 385/2; 385/143

(58) Field of Classification Search
USPC .............................................. 385/2, 143, 145
See application file for complete search history.

(56) References Cited

U.S. PATENT DOCUMENTS 7,005,245 B1 * 2/2006 Kubacki ........................ 430/321
2003/0228123 A1 * 12/2003 Andrews et al. .............. 385/143
2008/0025681 A1 * 1/2008 Shtein et al. .................. 385/128
2010/0307580 A1 * 12/2010 Carroll et al. ................. 136/256

FOREIGN PATENT DOCUMENTS

WO    2007130025 A1    11/2007

OTHER PUBLICATIONS

International Search Report for PCT/US2010/037757 mailed Sep. 16, 2010, 2 pgs.

* cited by examiner

Primary Examiner — Eric Wong
Assistant Examiner — Mary El Shammaa
(74) Attorney, Agent, or Firm — J. Clinton Wimbish; Smith Moore Leatherwood LLP

(57) ABSTRACT

The present invention provides an organic fibrous photovoltaic device with a frequency conversion region comprising a waveguide being arranged normal to the axis of the fiber.

24 Claims, 3 Drawing Sheets

PHOTOVOLTAIC DEVICE WITH FREQUENCY CONVERSION REGION

RELATED APPLICATION DATA

The present application hereby claims priority under 35 U.S.C. §119(e) to U.S. Provisional Patent Application Ser. No. 61/185,102 filed Jun. 8, 2009, which is hereby incorporated by reference in its entirety.

FIELD OF THE INVENTION

The present invention relates to organic optoelectronic devices and, in particular, to organic photovoltaic devices.

BACKGROUND OF THE INVENTION

Optoelectronic devices using organic materials are becoming increasingly desirable in a wide variety of applications for a number of reasons. Materials used to construct organic optoelectronic devices are relatively inexpensive in comparison to their inorganic counterparts thereby providing cost advantages over optoelectronic devices produced with inorganic materials. Moreover, organic materials provide desirable physical properties, such as flexibility, permitting their use in applications unsuitable for rigid materials. Examples of organic optoelectronic devices comprise organic photovoltaic cells, organic light emitting devices (OLEDs), and organic photodetectors.

Photovoltaic devices convert electromagnetic radiation into electricity by producing a photo-generated current when connected across a load and exposed to light. The electrical power generated by photovoltaic cells can be used in many applications including lighting, heating, battery charging, and powering devices requiring electrical energy.

When irradiated under an infinite load, a photovoltaic device produces its maximum possible voltage, the open circuit voltage or $V_{oc}$. When irradiated with its electrical contacts shorted, a photovoltaic device produces its maximum current, I short circuit or $I_{sc}$. Under operating conditions, a photovoltaic device is connected to a finite load, and the electrical power output is equal to the product of the current and voltage. The maximum power generated by a photovoltaic device cannot exceed the product of $V_{oc}$ and $I_{sc}$. When the load value is optimized for maximum power generation, the current and voltage have the values $I_{max}$ and $V_{max}$ respectively.

A key characteristic in evaluating a photovoltaic cell's performance is the fill factor, ff. The fill factor is the ratio of the photovoltaic cell's actual power to its power if both current and voltage were at their maxima. The fill factor of a photovoltaic cell is provided according to equation (1).

$$ff = (I_{max} V_{max})/(I_{sc} I_{oc}) \quad (1)$$

The fill factor of a photovoltaic is always less than 1, as $I_{sc}$ and $V_{oc}$ are never obtained simultaneously under operating conditions. Nevertheless, as the fill factor approaches a value of 1, a device demonstrates less internal resistance and, therefore, delivers a greater percentage of electrical power to the load under optimal conditions.

Photovoltaic devices may additionally be characterized by their efficiency of converting electromagnetic energy into electrical energy. The conversion efficiency, $\eta_p$, of a photovoltaic device is provided according to equation (2) where $P_{inc}$ is the power of the light incident on the photovoltaic.

$$\eta_p = ff^*(I_{sc} V_{oc})/P_{inc} \quad (2)$$

Devices utilizing crystalline or amorphous silicon dominate commercial applications, and some have achieved efficiencies of 23% or greater. However, efficient crystalline-based devices, especially of large surface area, are difficult and expensive to produce due to the problems in fabricating large crystals free from crystalline defects that promote exciton recombination. Commercially available amorphous silicon photovoltaic cells demonstrate efficiencies ranging from about 4 to 12%.

Constructing organic photovoltaic devices having efficiencies comparable to inorganic devices poses a technical challenge. Some organic photovoltaic devices demonstrate efficiencies on the order of 1% or less. The low efficiencies displayed in organic photovoltaic devices results from a severe length scale mismatch between exciton diffusion length ($L_D$) and organic layer thickness. In order to have efficient absorption of visible electromagnetic radiation, an organic film must have a thickness of about 500 nm. This thickness greatly exceeds exciton diffusion length which is typically about 50 nm, often resulting in exciton recombination.

It would be desirable to provide organic photovoltaic devices which display increased efficiencies in converting electromagnetic energy into electrical energy.

SUMMARY

The present invention provides organic optoelectronic devices, including organic photovoltaic devices, having a fiber structure and methods of making and using the same.

In one embodiment, the present invention provides an optoelectronic device comprising an optical fiber comprising a first region and a second region and a frequency conversion region disposed between the first region and the second region. In some embodiments, the first region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

In some embodiments, the second region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

In some embodiments, the first region and the second region can be considered separate and independent optical fibers coupled across the frequency conversion region.

A frequency conversion region disposed between the first region and the second region of an optical fiber, in some embodiments, is operable to alter or change the frequency of electromagnetic radiation passing through the region. In some embodiments, a frequency conversion region increases the frequency of electromagnetic radiation passing through the region. In some embodiments, a frequency conversion region decreases the frequency of electromagnetic radiation passing through the region.

In some embodiments, a frequency conversion region comprises a substrate having one or more upconverter materials, downconverter materials or mixtures thereof. In some embodiments, the substrate of the frequency conversion region is arranged normal to the longitudinal axis of the optical fiber. The substrate, in some embodiments, comprises a waveguide having an optical axis normal to the optical axis of the optical fiber.

In another aspect, the present invention provides a photoactive apparatus comprising at least a first photovoltaic cell and a second photovoltaic cell, the first photovoltaic cell and the second photovoltaic cell each comprising an optical fiber comprising a first region and a second region and a frequency conversion region disposed between the first region and the second region. In some embodiments, the first region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

Moreover, in some embodiments, the second region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

In some embodiments of a photoactive apparatus, a frequency conversion region comprises a substrate having one or more upconverter materials, downconverter materials or mixtures thereof. In some embodiments, the substrate of the frequency conversion region is arranged normal to the longitudinal axis of the optical fiber. The substrate, in some embodiments, comprises a waveguide having an optical axis normal to the optical axis of the optical fiber. In some embodiments, the frequency conversion region of the first photovoltaic cell and the frequency conversion region of the second photovoltaic cell comprise a substrate or waveguide continuous between the first photovoltaic cell and the second photovoltaic cell.

In another aspect, the present invention provides methods of making a photovoltaic apparatus. In some embodiments, a method of making a photovoltaic apparatus comprises providing an optical fiber core comprising a first region and a second region and a frequency conversion region disposed between the first region and the second region, disposing a radiation transmissive electrode on a surface of the first region of the optical fiber core, disposing at least one photosensitive organic layer in electrical communication with the radiation transmissive electrode of the first region and disposing an electrode in electrical communication with the photosensitive organic layer of the first region.

In some embodiments, a method of making a photovoltaic apparatus further comprises disposing a radiation transmissive electrode on a surface of the second region of the optical fiber core, disposing at least one photosensitive organic layer in electrical communication with the radiation transmissive electrode of the second region and disposing an electrode in electrical communication with the photosensitive organic layer of the second region.

In a further aspect, the present invention provides methods of converting photonic energy into electrical energy. In some embodiments, a method of converting photonic energy into electrical energy comprises receiving electromagnetic radiation along the optical axis of an optical fiber comprising a first region and a second region separated by a frequency conversion region, transmitting at least a portion of the electromagnetic radiation into a photosensitive organic layer through a radiation transmissive electrode surrounding the first region of the optical fiber, generating excitons in the photosensitive organic layer and separating the excitons into holes and electrons at one or more heterojunctions in the photosensitive organic layer. The electrons, in some embodiments, are removed into an external electrical circuit.

In some embodiments, a method of converting photonic energy into electrical energy further comprises passing a portion of electromagnetic radiation not transmitted into the photosensitive organic layer surrounding the first region of the optical fiber through the frequency conversion region and changing the frequency of the electromagnetic radiation. In some embodiments, the frequency altered electromagnetic radiation is passed to the second region of the optical fiber, wherein at least a portion of the frequency altered electromagnetic radiation is transmitted into a photosensitive organic layer through a radiation transmissive electrode surrounding the second region of the optical fiber to generate excitons in the photosensitive organic layer. The excitons are subsequently separated at one or more bulk heterojunctions in the photosensitive organic layer of the second region of the optical fiber.

These and other embodiments of the present invention are described in greater detail in the detailed description which follows.

DETAILED DESCRIPTION

The present invention provides organic optoelectronic devices, including organic photovoltaic devices, having a fiber structure. In some embodiments, optical fiber optoelectronic devices described herein are photovoltaic apparatus.

In some embodiments, an optoelectronic device is provided comprising an optical fiber comprising a first region and a second region and a frequency conversion region disposed between the first region and the second region. In some embodiments, the first region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

In some embodiments, the second region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

A frequency conversion region disposed between the first region and the second region of an optical fiber, in some embodiments, is operable to alter or change the frequency of electromagnetic radiation passing through or interacting with the region. In some embodiments, a frequency conversion region increases the frequency of electromagnetic radiation passing through the region. In some embodiments, a frequency conversion region decreases the frequency of electromagnetic radiation passing through the region.

Figure 1:
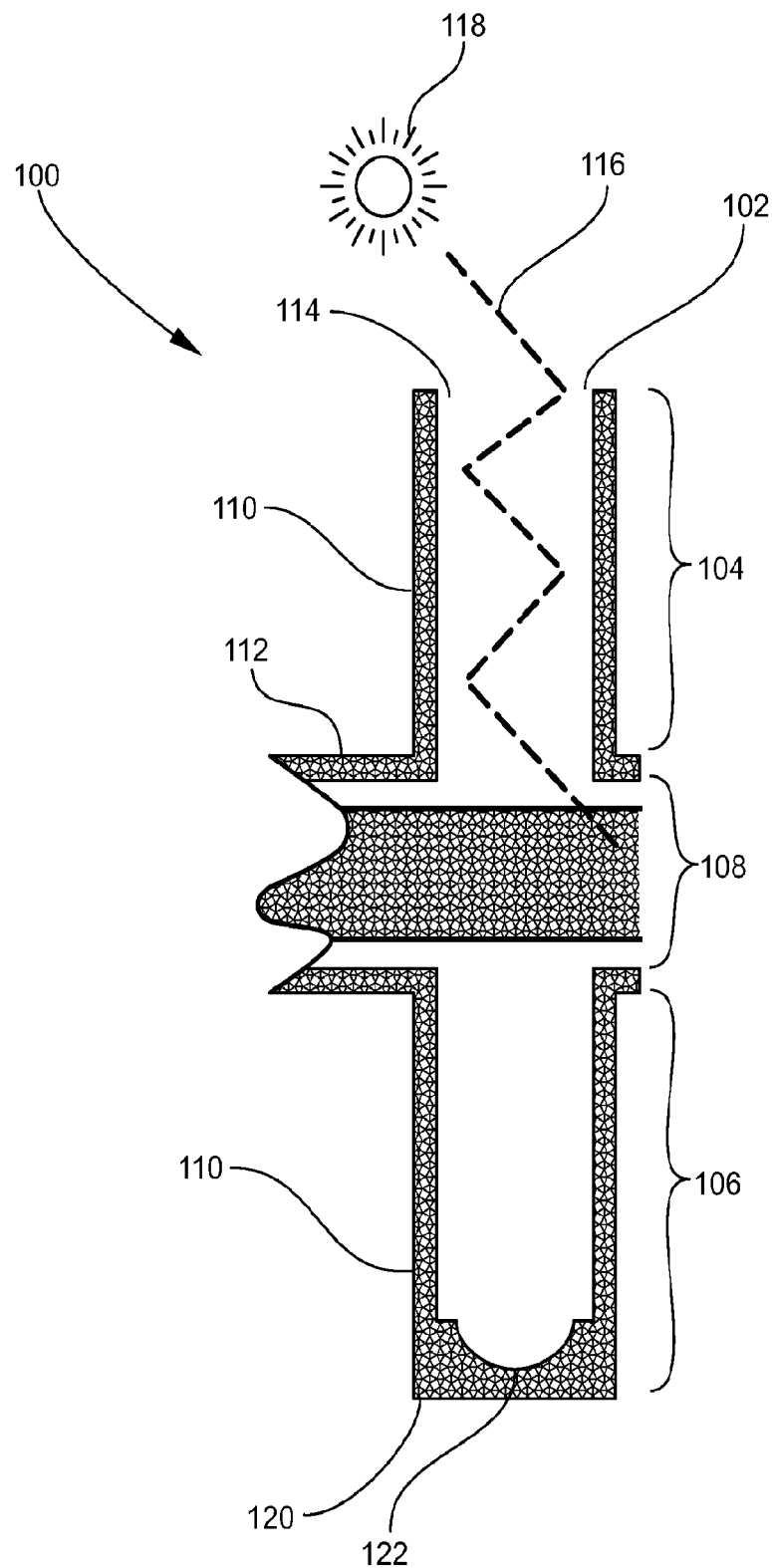
FIG. 1 illustrates a cross-sectional view optoelectronic device according to one embodiment of the present invention.

FIG. 1 illustrates a cross-sectional view of an optoelectronic device according to one embodiment of the present invention. The optoelectronic device (100) of FIG. 1 comprises an optical fiber (102) comprising a first region (104) and a second region (106). A frequency conversion region (108) is disposed between the first region (104) and the second region (106) of the optical fiber (102). As described herein, each of the first region (104) and the second region (106) comprise a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer, collectively illustrated in FIG. 1 as (110).

In the embodiment of FIG. 1, the frequency conversion region (106) comprises a waveguiding substrate (112) arranged normal to the longitudinal axis of the optical fiber (102). Moreover, in the embodiment of FIG. 1, the waveguiding substrate (112) is continuous with the first region (104) and the second region (106) of the optical fiber (102). In being continuous with one another in the embodiment of FIG. 1, an interfacial boundary is not established between the waveguiding substrate (112) and the first region (104) and the second region (106) of the optical fiber (102).

In other embodiments, however, the first and/or second regions of an optical fiber are not continuous with the substrate or waveguide of the frequency conversion region resulting in an interfacial boundary being established between the substrate or waveguide and the first region and/or second region of the optical fiber.

As illustrated in FIG. 1, the optical fiber (102) is unobstructed at end (114) to permit the transmission of light (116) from a light source (118), such as the sun, down the longitudinal axis of the optical fiber (102) for interaction with the photosensitive organic layers of the first (104) and/or second regions (106) of the optical fiber (102). In some embodiments, one or more microlenses (not shown) are positioned over the unobstructed ends (114). In the embodiment of FIG. 1, the opposing end (120) of the optical fiber (102) comprises a reflector (122) for reflecting any light (116) not absorbed by the photosensitive organic layers of the first (104) and/or second (106) regions. Reflecting non-absorbed light (116) can provide one or more additional opportunities for the light (116) to interact with a photosensitive layer of the first (104) and/or second region (106) of the optical fiber. In some embodiments, a reflector comprises a hemispherical reflector.

Turning now to components that can be included in various embodiments of optoelectronic devices described herein, optoelectronic devices described herein comprise an optical fiber comprising a first region and a second region. Optical fibers suitable for use in some embodiments described herein comprise glass optical fibers, quartz optical fibers and/or plastic optical fibers (POF). Plastic optical fibers, in some embodiments, can be constructed of any polymeric material not inconsistent with the objectives of the present invention. In some embodiments, plastic optical fibers comprise a polyacrylic such as polymethyl methacrylate. In some embodiments, plastic optical fibers can be constructed of perfluorocyclobutane (PFBC) containing polymers, such as perfluorocyclobutane poly(arylether)s. In some embodiments, optical fibers further comprise one or more upconverters described herein. In some embodiments, one or more upconverters are incorporated into and/or coated onto the first and/or second region of the optical fiber. In some embodiments, upconverters in the optical fiber can be the same or different than those of the frequency conversion region.

Optical fibers, according to some embodiments of the present invention, can comprise single mode optical fibers and multi-mode optical fibers. Optical fibers for use in the present invention can be flexible and/or hollow.

In some embodiments, a first region and/or second region of an optical fiber of an optoelectronic device described herein can have any desired diameter not inconsistent with the objectives of the present invention. In some embodiments, the first region and/or second region of an optical fiber has a diameter ranging from about 1 μm to about 2 mm. In some embodiments, a first region and/or second region of an optical fiber can have a diameter ranging from about 90 μm to about 1 mm. In a further embodiment, a first region and/or second region of an optical fiber can have a diameter ranging from about 20 μm to about 800 μm.

In some embodiments, the diameter of the first region and the diameter of the second region of an optical fiber are selected independently of one another. In some embodiments, the first region of an optical fiber and the second region of the optical fiber have the same or substantially the same diameter. In some embodiments, the first region of an optical fiber and the second region of an optical fiber have different diameters.

In some embodiments, the first region and/or second region of an optical fiber, can have any desired length not inconsistent with the objectives of the present invention. In some embodiments, the first region and/or second region of an optical fiber can have a length ranging from about 500 nm to about 100 mm. In some embodiments, the first and/or second region of an optical fiber can have a length ranging from about 1 μm to about 1 mm. In a further embodiment, the first and/or second region of an optical fiber can have a length ranging from about 10 μm to about 100 μM.

In some embodiments, the length of the first region and the length of the second region of an optical fiber are selected independently of one another. In some embodiments, the first region of an optical fiber and the second region of the optical fiber have the same or substantially the same length. In some embodiments, the first region of an optical fiber and the second region of an optical fiber have different lengths.

As described herein, the first region of an optical fiber comprises a radiation transmissive electrode surrounding the optical fiber, and the second region of the optical fiber comprises a radiation transmissive electrode surrounding the optical fiber. Radiation transmissive, as used herein, refers to the ability to at least partially pass radiation in the visible region of the electromagnetic spectrum. In some embodiments, radiation transmissive materials can pass visible electromagnetic radiation with minimal absorbance or other interference. Moreover, electrodes, as used herein, refer to layers that provide a medium for delivering photo-generated current to an external circuit or providing bias voltage to the optoelectronic device. An electrode provides the interface between the photoactive regions of an organic optoelectronic device and a wire, lead, trace, or other means for transporting the charge carriers to or from the external circuit.

A radiation transmissive electrode of the first and/or second regions of an optical fiber, according to some embodiments, comprises a radiation transmissive conducting oxide. Radiation transmissive conducting oxides, in some embodiments, can comprise indium tin oxide (ITO), gallium indium tin oxide (GITO), and zinc indium tin oxide (ZITO). In another embodiment, a radiation transmissive electrode of the first and/or second region of an optical fiber can comprise a radiation transmissive polymeric material such as polyaniline (PANI) and its chemical relatives. In some embodiments, 3,4-polyethylenedioxythiophene (PEDOT) can be a suitable radiation transmissive polymeric material for the radiation transmissive electrode of the first and/or second region. In other embodiments, a radiation transmissive electrode can comprise a carbon nanotube layer having a thickness operable to at least partially pass visible electromagnetic radiation.

In some embodiments, the composition of the radiation transmissive electrode of the first region of the optical fiber is selected independently from the composition of the radiation transmissive electrode of the second region of the optical fiber. In some embodiments, the composition of the radiation transmissive electrode of the first region is different than the composition of the radiation transmissive electrode of the second region of the optical fiber. In some embodiments, the composition of the radiation transmissive electrode of the first region is the same or substantially the same as the composition of the radiation transmissive electrode of the second region of the optical fiber.

The first region of an optical fiber also comprises at least one photosensitive organic layer surrounding the radiation transmissive electrode and electrically connected to the radiation transmissive electrode. Moreover, the second region of an optical fiber also comprises at least one photosensitive organic layer surrounding the radiation transmissive electrode and electrically connected to the radiation transmissive electrode.

A photosensitive organic layer of the first region and/or second region of an optical fiber comprises at least one photoactive region in which electromagnetic radiation is absorbed to produce excitons which may subsequently dissociate into electrons and holes. In some embodiments, a photoactive region can comprise a polymer. Polymers suitable for use in a photoactive region of a photosensitive organic layer, in one embodiment, can comprise conjugated polymers such as thiophenes including poly(3-hexylthiophene) (P3HT), poly(3-octylthiophene) (P3OT), and polythiophene (PTh).

In some embodiments, polymers suitable for use in a photoactive region of a photosensitive organic layer can comprise semiconducting polymers. In one embodiment, semiconducting polymers include phenylene vinylenes, such as poly(phenylene vinylene) and polyp-phenylene vinylene) (PPV), and derivatives thereof. In other embodiments, semiconducting polymers can comprise poly fluorenes, naphthalenes, and derivatives thereof. In a further embodiment, semiconducting polymers for use in a photoactive region of a photosensitive organic layer can comprise poly(-vinylpyridine) (P2VP), polyamides, poly(N-vinylcarbazole) (PVCZ), polypyrrole (PPy), and polyaniline (PAn).

A photoactive region, according to some embodiments, can comprise small molecules. In one embodiment, small molecules suitable for use in a photoactive region of a photosensitive organic layer can comprise coumarin 6, coumarin 30, coumarin 102, coumarin 110, coumarin 153, and coumarin 480 D. In another embodiment, a small molecule can comprise merocyanine 540. In a further embodiment, small molecules can comprise 9,10-dihydrobenzo[a]pyrene-7 (8H)-one, 7-methylbenzo[a]pyrene, pyrene, benzo[e]pyrene, 3,4-dihydroxy-3-cyclobutene-1,2-dione, and 1,3-bis[4-(dimethylamino)phenyl-2,4-dihydroxycyclobutenediylium dihydroxide.

In some embodiments of the present invention, exciton dissociation is precipitated at heterojunctions in the photosensitive organic layer of the first region and/or the second region of an optical fiber, the heterojunctions formed between adjacent donor and acceptor materials. Photosensitive organic layers, in some embodiments described herein, comprise at least one bulk heterojunction formed between donor and acceptor materials. In other embodiments, photosensitive organic layers comprise a plurality of bulk heterojunctions formed between donor and acceptor materials.

In the context of organic materials, the terms donor and acceptor refer to the relative positions of the highest occupied molecular orbital (HOMO) and lowest unoccupied molecular orbital (LUMO) energy levels of two contacting but different organic materials. This is in contrast to the use of these terms in the inorganic context, where donor and acceptor may refer to types of dopants that may be used to create inorganic n- and p-type layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A photoactive region in a photosensitive organic layer, according to some embodiments described herein, comprises a polymeric composite material. The polymeric composite material, in some embodiments, can comprise a nanoparticle phase dispersed in a polymeric phase. Polymers suitable for producing the polymeric phase of a photoactive region can comprise conjugated polymers such as thiophenes including poly(3-hexylthiophene) (P3HT) and poly(3-octylthiophene) (P3OT).

In some embodiments, the nanoparticle phase dispersed in the polymeric phase of a polymeric composite material comprises at least one carbon nanoparticle. Carbon nanoparticles can comprise fullerenes, carbon nanotubes, or mixtures thereof. Fullerenes suitable for use in the nanoparticle phase, in one embodiment, can comprise 1-(3-methoxycarbonyl) propyl-1-phenyl(6,6)$C_{61}$ (PCBM). Carbon nanotubes for use in the nanoparticle phase, according to some embodiments, can comprise single-walled nanotubes, multi-walled nanotubes, or mixtures thereof.

In some embodiments described herein, the polymer to nanoparticle ratio in polymeric composite materials ranges from about 1:4 to about 1:0.4. In other embodiments, the polymer to nanoparticle ratio in polymeric composite materials ranges from about 1:2 to about 1:0.6. In one embodiment, for example, the ratio of poly(3-hexylthiophene) to PCBM ranges from about 1:1 to about 1:0.4.

In a further embodiment, the nanoparticle phase dispersed in the polymeric phase comprises at least one nanowhisker. A nanowhisker, as used herein, refers to a crystalline carbon nanoparticle formed from a plurality of carbon nanoparticles. Nanowhiskers, in some embodiments, can be produced by annealing a photosensitive organic layer comprising the polymeric composite material. Carbon nanoparticles operable to form nanowhiskers, according to some embodiments, can comprise single-walled carbon nanotubes, multi-walled carbon nanotubes, and fullerenes. In one embodiment, nanowhiskers comprise crystalline PCBM. Annealing the photosensitive organic layer, in some embodiments, can further increase the dispersion of the nanoparticle phase in the polymeric phase.

In some embodiments of photoactive regions comprising a polymeric phase and a nanoparticle phase, the polymeric phase serves as a donor material and the nanoparticle phase serves as the acceptor material thereby forming a heterojunction for the separation of excitons into holes and electrons. In embodiments wherein nanoparticles are dispersed throughout the polymeric phase, the photoactive region of the organic layer comprises a plurality of bulk heterojunctions.

In further embodiments, donor materials in a photoactive region of a photosensitive organic layer can comprise organometallic compounds including porphyrins, phthalocyanines, and derivatives thereof. Through the use of an organometallic material in the photoactive region, photosensitive devices incorporating such materials may efficiently utilize triplet excitons. It is believed that the singlet-triplet mixing may be so strong for organometallic compounds that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency.

In some embodiments, acceptor materials in a photoactive region of a photosensitive organic layer can comprise perylenes, naphthalenes, and mixtures thereof.

In some embodiments, the composition of the photosensitive organic layer of the first region of the optical fiber is selected independently from the composition of the photosensitive organic layer of the second region of the optical fiber. In some embodiments, the composition of the photosensitive organic layer of the first region is different than the composition of the photosensitive organic layer of the second region of the optical fiber. In some embodiments, for example, the composition of the photosensitive organic layer of the first region is selected to absorb electromagnetic radiation from a first region of the electromagnetic spectrum, and the composition of the second photosensitive organic layer is selected to absorb electromagnetic radiation from a second region of the electromagnetic spectrum different from the first region.

In some embodiments, the composition of the photosensitive organic layer of the first region is the same or substantially the same as the composition of the photosensitive organic layer of the second region of the optical fiber.

In some embodiments, a photosensitive organic layer of the first region and/or second region has a thickness ranging from about 10 nm to about 1 µm. In some embodiments, a photosensitive organic layer has a thickness ranging from about 50 nm to about 800 nm. A photosensitive organic layer, in some embodiments, has a thickness ranging from about 100 nm to about 300 nm. The thicknesses of the photosensitive organic layers of the first region and the second region, in some embodiments, are selected independently of one another. In some embodiments, the photosensitive organic layer of the first region of the optical fiber has a thickness greater than the photosensitive organic layer of the second region of the optical fiber. In some embodiments, the photosensitive layer of the second region of the optical fiber has a thickness greater than the photosensitive organic layer of the first region of the optical fiber. Additionally, in some embodiments, the photosensitive organic layers of the first and second regions have the same thickness or substantially the same thickness.

As described herein, the first region of an optical fiber comprises an electrode surrounding the photosensitive organic layer of the first region and electrically connected to the photosensitive organic layer. The second region of the optical fiber comprises an electrode surrounding the photosensitive organic layer of the second region and electrically connected to the photosensitive organic layer. In some embodiments, an electrode surrounding a photosensitive organic layer of the first and/or second region of an optical fiber comprises a metal. As used herein, metal refers to both materials composed of an elementally pure metal, e.g., gold, silver, copper, nickel, and also metal alloys comprising materials composed of two or more elemental materials. In some embodiments, an electrode comprises gold, silver, aluminum or copper. In some embodiments, an electrode surrounding a photosensitive organic layer of the first and/or second region is opaque.

In some embodiments, the composition of an electrode of the first region of the optical fiber is selected independently from the composition of an electrode of the second region of the optical fiber. In some embodiments, the composition of the electrode surrounding the photosensitive organic layer of the first region is different than the composition of the electrode surrounding the photosensitive organic layer of the second region of the optical fiber. In some embodiments, the composition of the electrode surrounding the photosensitive organic layer of the first region is the same or substantially the same as the composition of the electrode surrounding the photosensitive organic layer of the second region of the optical fiber.

An electrode surrounding a photosensitive organic layer of the first and/or second region of an optical fiber can have any thickness not inconsistent with the objectives of the present invention. In some embodiments, an electrode has a thickness ranging from about 10 nm to about 10 µm. In some embodiments, an electrode has a thickness ranging from about 100 nm to about 100 µm. An electrode, in some embodiments, has a thickness ranging from about 200 nm to about 800 nm.

The thicknesses of the electrodes of the first region and the second region, in some embodiments, are selected independently of one another. In some embodiments, an electrode surrounding the photosensitive organic layer of the first region of the optical fiber has a thickness greater than an electrode surrounding the photosensitive organic layer of the second region of the optical fiber. In some embodiments, an electrode surrounding the photosensitive organic layer of the second region of the optical fiber has a thickness greater than the electrode surrounding the photosensitive organic layer of the first region of the optical fiber. Additionally, in some embodiments, the electrodes of the first and second regions have the same thickness or substantially the same thickness.

A layer comprising lithium fluoride (LiF), according to some embodiments, can be disposed between a photosensitive organic layer and an electrode surrounding the photosensitive organic layer. The LiF layer can have a thickness ranging from about 5 angstroms to about 10 angstroms.

In some embodiments, the LiF layer can be at least partially oxidized resulting in a layer comprising lithium oxide ($Li_2O$) and LiF. In other embodiments, the LiF layer can be completely oxidized resulting in a lithium oxide layer deficient or substantially deficient of LiF. In some embodiments, a LiF layer is oxidized by exposing the LiF layer to oxygen, water vapor, or combinations thereof. In one embodiment, for example, a LiF layer is oxidized to a lithium oxide layer by exposure to an atmosphere comprising water vapor and/or oxygen at partial pressures of less than about $10^{-6}$ Torr. In another embodiment, a LiF layer is oxidized to a lithium oxide layer by exposure to an atmosphere comprising water vapor and/or oxygen at partial pressures less than about $10^{-7}$ Torr or less than about $10^{-8}$ Torr.

In some embodiments, a LiF layer is exposed to an atmosphere comprising water vapor and/or oxygen for a time period ranging from about 1 hour to about 15 hours. In one embodiment, a LiF layer is exposed to an atmosphere comprising water vapor and/or oxygen for a time period greater than about 15 hours. In a further embodiment, a LiF layer is exposed to an atmosphere comprising water vapor and/or oxygen for a time period less than about one hour. The time period of exposure of the LiF layer to an atmosphere comprising water vapor and/or oxygen, according to some embodiments of the present invention, is dependent upon the partial pressures of the water vapor and/or oxygen in the atmosphere. The higher the partial pressure of the water vapor or oxygen, the shorter the exposure time.

Optoelectronic devices described herein, in some embodiments, can further comprise additional layers such as one or more exciton blocking layers. In some embodiments described herein, an exciton blocking layer (EBL) can act to confine photogenerated excitons to the region near the dissociating interface and prevent parasitic exciton quenching at a photosensitive organic/electrode interface. In addition to limiting the path over which excitons may diffuse, an EBL can additionally act as a diffusion barrier to substances introduced during deposition of the electrodes. In some embodiments, an EBL can have a sufficient thickness to fill pin holes or shorting defects which could otherwise render an organic photovoltaic device inoperable.

An EBL, according to some embodiments of the present invention, can comprise a polymeric composite material. In one embodiment, an EBL comprises carbon nanoparticles dispersed in 3,4-polyethylenedioxythiophene:polystyrenesulfonate (PEDOT:PSS). In another embodiment, an EBL comprises carbon nanoparticles dispersed in poly(vinylidene chloride) and copolymers thereof. Carbon nanoparticles dispersed in the polymeric phases including PEDOT:PSS and poly(vinylidene chloride) can comprise single-walled nanotubes, multi-walled nanotubes, fullerenes, or mixtures thereof. In further embodiments, EBLs can comprise any polymer having a work function energy operable to permit the transport of holes while impeding the passage of electrons.

In some embodiments, an EBL may be disposed between the radiation transmissive electrode and a photosensitive organic layer of the first and/or second region of an optoelectronic device. In some embodiments wherein the optoelectronic device comprises a plurality of photosensitive organic layers, EBLs can be disposed between the photosensitive organic layers.

Optoelectronic devices of the present invention, in some embodiments, can further comprise an external metallic contact. In one embodiment, the external metallic contact contacts the electrode surrounding the photosensitive organic layer of the first and/or second region of the optical fiber. The external metallic contact, in some embodiments, can be operable to extract current over at least a portion of the circumference and length of the fiber optoelectronic device. External metallic contacts, in some embodiments, can comprise metals including gold, silver, or copper. In a further embodiment, external metal contacts can be operable to reflect non-absorbed electromagnetic radiation back into at least one photosensitive organic layer for further absorption.

Optoelectronic devices, according to some embodiments of the present invention, can further comprise charge transfer layers. Charge transfer layers, as used herein, refer to layers which only deliver charge carriers from one section of an optoelectronic device to another section. In one embodiment, for example, a charge transfer layer can comprise an exciton blocking layer.

A charge transfer layer, in some embodiments, can be disposed between a photosensitive organic layer and radiation transmissive electrode of the first and/or second region of the optical fiber. In some embodiments, a charge transfer layer is disposed between a photosensitive organic layer and non-radiation transmissive electrode surrounding the photosensitive organic layer of the first and/or second region of the optical fiber. Charge transfer layers, according to some embodiments, are not photoactive.

Figure 2:
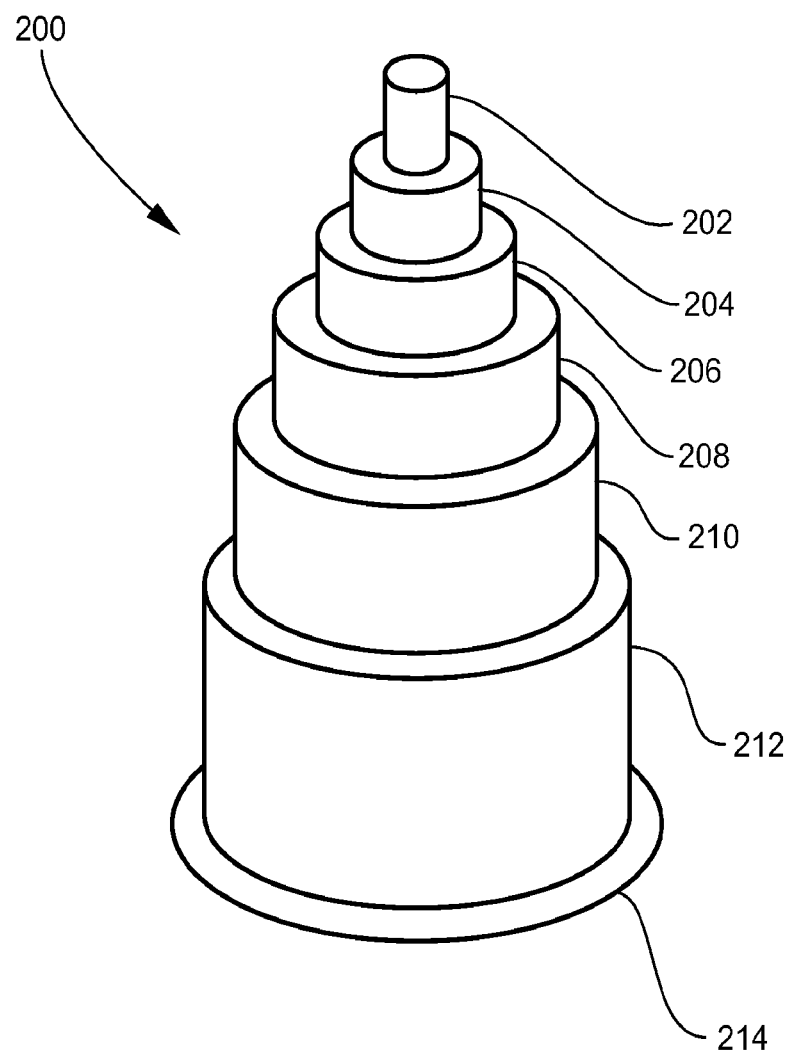
FIG. 2 illustrates a cut away view of first region of an optical fiber of an optoelectronic apparatus according to one embodiment of the present invention.

FIG. 2 illustrates a cut away view of a first region of an optical fiber of an optoelectronic apparatus according to one embodiment of the present invention. The optical fiber (202) of the first region (200) is longitudinally surrounded by a radiation transmissive electrode (204). The radiation transmissive electrode (204) can comprise a radiation transmissive conducting oxide such as indium tin oxide, gallium indium tin oxide, or zinc indium tin oxide. The radiation transmissive electrode (204) is surrounded by an exciton blocking layer (206). In some embodiments, the EBL (206) can comprise carbon nanoparticles dispersed in a polymeric phase such as 3,4-polyethylenedioxythiophene or poly(vinylidene chloride).

The EBL (206) is surrounded by an photosensitive organic layer (208). The photosensitive organic layer (208), in some embodiments, comprises a P3HT-carbon nanoparticle polymeric composite. The photosensitive organic layer (208), in some embodiments, can be in direct electrical communication with the radiation transmissive first electrode (204). In other embodiments, a charge transfer layer, including an exciton blocking layer, may be disposed between the radiation transmissive electrode (204) and the photosensitive organic layer (208) to provide indirect electrical communication between the radiation transmissive electrode (204) and the photosensitive organic layer (208).

The photosensitive organic layer (208) is surrounded by an electrode (210). The photosensitive organic layer (208), in some embodiments, can be in direct electrical communication with the electrode (210). In other embodiments, a charge transfer layer, such as an exciton blocking layer, (not shown) may be disposed between the photosensitive organic layer (208) and the electrode (210) to provide indirect electrical communication between the photosensitive organic layer (208) and the electrode (210). In some embodiments, the electrode (210) comprises a metal, such as aluminum, gold, silver, nickel, or copper.

The electrode (210) is surrounded by a protective layer (212) comprising a polymeric composite material. In some embodiments, the polymeric composite material of the protective layer comprises carbon nanoparticles dispersed in poly(vinylidene chloride) and/or copolymers thereof. The carbon nanoparticles can comprise single-walled carbon nanotubes, multi-walled carbon nanotubes, fullerenes, or mixtures thereof.

The protective layer (212) is surrounded by an external metal contact (214) operable to extract current over a length and circumference of the fiber optoelectronic device. In some embodiments, an external metallic (214) contact can comprise metals including gold, silver, or copper.

As described herein, an optoelectronic apparatus comprises a frequency conversion region disposed between the first region and the second region of the optical fiber. A frequency conversion region, in some embodiments, is operable to alter or change the frequency of electromagnetic radiation interacting with the region. In some embodiments, a frequency conversion region increases the frequency of electromagnetic radiation interacting with the region. In some embodiments, a frequency conversion region decreases the frequency of electromagnetic radiation interacting with the region.

In some embodiments, a frequency conversion region comprises a substrate or waveguide having one or more upconverter materials, downconverter materials or mixtures thereof.

Upconverters, in some embodiments, can include materials comprising at least one Lanthanide series element. In some embodiments, upconverter materials can comprise nanoparticles comprising at least one Lanthanide series element. Lanthanide series elements suitable for use in upconverter materials according to some embodiments of the present invention comprise erbium, ytterbium, dysprosium, holmium, or mixtures thereof. In some embodiments, upconverter materials comprise metal oxides and metal sulfides doped with ions of erbium, ytterbium, dysprosium, holmium, or mixtures thereof. In other embodiments, optical fibers may be doped directly with ions of erbium, ytterbium, dysprosium, holmium, or mixtures thereof.

In other embodiments, upconverter materials can comprise organic chemical species. Organic upconverter materials can comprise $H_2C_6N$ and 4-dialkylamino-1,8-naphthalimides as well as 1,8-naphthalimide derivatives and compounds, such as multibranched naphthalimide derivatives TPA-NA1, TPA-NA2, and TPA-NA3. Organic upconverter materials can also comprise 4-(dimethylamino)cinnamonitrile (cis and trans), trans-4-[4-(dimethylamino)styryl]-1-methylpyridinium iodide, 4-[4-(dimethylamino)styryl]pyridine, 4-(diethylamino)benzaldehyde diphenylhydrazone, trans-4-[4-(dimethylamino)styryl]-1-methylpyridiniump-toluenesulfonate, 2-[ethyl[4-[2-(4-nitrophenyl)ethenyl]phenyl]amino]ethanol, 4-dimethylamino-4'-nitrostilbene, Disperse Orange 25, Disperse Orange 3, and Disperse Red 1.

In a further embodiment, upconverter materials can comprise quantum dots. Quantum dots, according to some embodiments, can comprise III/V and II/VI semiconductor materials, such as cadmium selenide (CdSe), cadmium telluride (CdTe), and zinc selenide (ZnSe). Upconverter materials can also comprise core-shell architectures of quantum dots. In some embodiments, upconverters comprise phosphors such as ytterbium and/or erbium codoped with lanthanum molybdate.

In addition to those provided herein, some embodiments of the present invention contemplate additional upconverter materials comprising transition metals, such as chromium. In some embodiments, a substrate or waveguide of a frequency conversion region does not comprise upconverter and/or downconverter materials and serves to separate the first region of the optical fiber from the second region of the optical fiber.

In some embodiments, a frequency conversion region converts infrared radiation received by the optoelectronic device into visible radiation for absorption by the photosensitive organic layer of the first and/or second region of the optical fiber. In some embodiments, infrared radiation converted into visible radiation comprises near infrared radiation (NIR), short wavelength infrared radiation (SWIR) or mid-wavelength radiation (MWIR) or mixtures thereof.

The substrate of a frequency conversion region can have any desired thickness not inconsistent with the objectives of the present invention. In some embodiments, a frequency conversion region has a thickness or path length to allow for sufficient upconversion and/or downconversion of electromagnetic radiation interacting with the frequency conversion region. In some embodiments, a frequency conversion region has a thickness ranging from about 50 μm to about 500 mm. In some embodiments, a frequency conversion region has a thickness ranging from about 100 μm to about 100 mm.

In some embodiments, the substrate of the frequency conversion region is arranged normal to the longitudinal axis of the optical fiber. The substrate, in some embodiments, comprises a waveguide. In some embodiments, the optical axis of a waveguiding substrate is normal to the optical axis of the optical fiber.

Moreover, a substrate, in some embodiments, is continuous with the first and/or second region of the optical fiber. In being continuous with one another, in some embodiments, an interfacial boundary is not established between the substrate and the first region and/or the second region of the optical fiber.

In other embodiments, however, the first and/or second regions of an optical fiber are not continuous with the substrate of the frequency conversion region resulting in an interfacial boundary being established between the substrate and the first region and/or second region of the optical fiber.

A substrate of a frequency conversion region can comprise any material not inconsistent with the objectives of the present invention. In embodiments wherein a substrate is a waveguide, the material out of which the substrate is constructed can support the propagation of light along an axis of the substrate.

In some embodiments, a substrate comprises a polymeric material including, but not limited to, a polyacrylate such as polymethylmethacrylate (PMMA), polymethacrylate (PMA) or polyacrylic acid (PAA) or combinations thereof. In some embodiments, a substrate comprises perfluorocyclobutane (PFBC) containing polymers, such as perfluorocyclobutane poly(arylether)s. In some embodiments, a substrate comprises polystyrene or copolymers thereof. Moreover, in some embodiments, a substrate comprises a silica glass including, but not limited to, quartz, fused quartz, fused silica or borosilicate glasses.

In some embodiments wherein the substrate of a frequency conversion region is a waveguide, one or both ends of the substrate terminate in a photovoltaic apparatus. In some embodiments, a photovoltaic apparatus positioned at the end or edge of a waveguiding substrate can collect any light propagating along the waveguiding substrate for conversion into electrical energy. In some embodiments, a photovoltaic apparatus positioned at the end or edge of a waveguiding structure comprises an organic construction, inorganic construction or combinations thereof. Inorganic photovoltaic devices, in some embodiments, comprise II/VI semiconductor materials, III/V semiconductor materials or group IV semiconductor materials. In some embodiments, inorganic photovoltaic devices comprise CIGS architectures.

In another aspect, the present invention provides a photoactive apparatus comprising a first photovoltaic cell and a second photovoltaic cell, the first photovoltaic cell and the second photovoltaic cell each comprising an optical fiber comprising a first region and a second region and a frequency conversion region disposed between the first region and the second region. In some embodiments, the first region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

Moreover, in some embodiments, the second region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

In some embodiments of a photoactive apparatus, a frequency conversion region comprises a substrate having one or more upconverter materials, downconverter materials or mixtures thereof. In some embodiments, the substrate of the frequency conversion region is arranged normal to the longitudinal axis of the optical fiber. The substrate, in some embodiments, comprises a waveguide independent from the optical fiber. In some embodiments, the frequency conversion region of the first photovoltaic cell and the frequency conversion region of the second photovoltaic cell comprise a substrate continuous between the first photovoltaic cell and the second photovoltaic cell.

In another aspect, the present invention provides a photoactive apparatus comprising at least a first photovoltaic cell and a second photovoltaic cell, the first photovoltaic cell and the second photovoltaic cell each comprising an optical fiber comprising a first region and a second region and a frequency conversion region disposed between the first region and the second region. In some embodiments, the first region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

Moreover, in some embodiments, the second region of the optical fiber comprises a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer.

In some embodiments, the first and second regions of the optical fiber can have any construction described herein for an optoelectronic device. In some embodiments, for example, the first and second regions of an optical fiber of a photoactive apparatus can have a construction consistent with that provided in FIG. 2.

In some embodiments of a photoactive apparatus, a frequency conversion region comprises a substrate having one or more upconverter materials, downconverter materials or mixtures thereof. In some embodiments, the substrate of the frequency conversion region is arranged normal to the longitudinal axis of the optical fiber. The substrate, in some embodiments, comprises a waveguide having an optical axis normal to the optical axis of the optical fiber. In some embodiments, the frequency conversion region of the first photovoltaic cell and the frequency conversion region of the second photovoltaic cell comprise a substrate or waveguide continuous between the first photovoltaic cell and the second photovoltaic cell.

In some embodiments, a frequency conversion region can have any construction described herein for an optoelectronic device.

Figure 3:
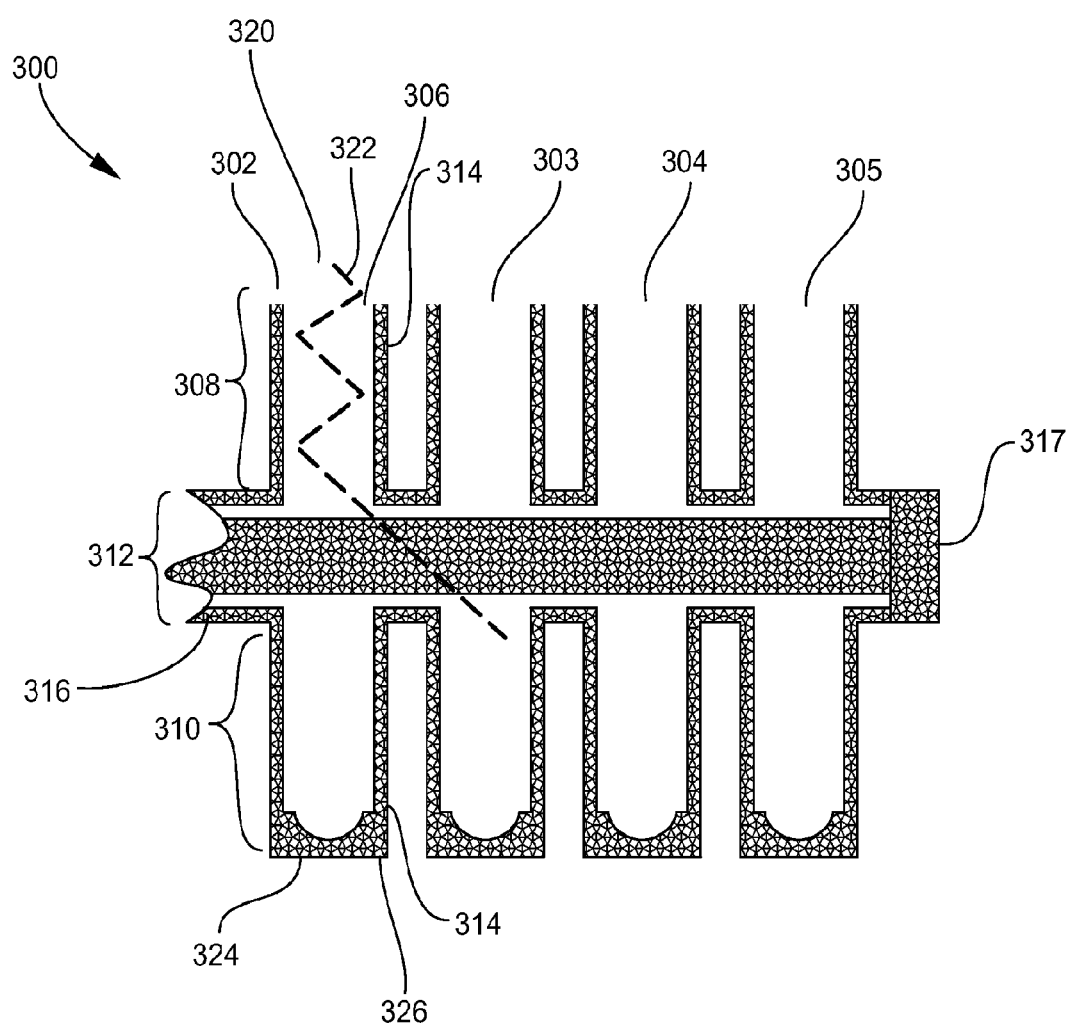
FIG. 3 illustrates a photoactive apparatus according to one embodiment of the present invention.

FIG. 3 illustrates a cross-sectional view of a photoactive apparatus according to one embodiment of the present invention. The photoactive apparatus (300) illustrated in FIG. 3 comprises a plurality of photovoltaic cells (302, 303, 304, 305). Each of the plurality of photovoltaic cells (302, 303, 304, 305) comprises an optical fiber (306) comprising a first region (308) and a second region (310). A frequency conversion region (312) is disposed between the first region (308) and the second region (310) of each optical fiber (306).

As described herein, the first region (308) and the second region (310) of each optical fiber (306) comprise a radiation transmissive electrode surrounding the optical fiber, at least one photosensitive organic layer surrounding the radiation transmissive electrode and electrically connected to the radiation transmissive electrode and an electrode surrounding the photosensitive organic layer and electrically connected to the photosensitive organic layer, collectively illustrated in FIG. 3 as (314).

In the embodiment of FIG. 3, the frequency conversion region (312) comprises a waveguiding substrate (316) arranged normal to the longitudinal axis of the optical fibers (306). Moreover, in the embodiment of FIG. 3, the waveguiding substrate (312) is continuous with the first region (308) and the second region (310) of the optical fibers (306). In being continuous with one another in the embodiment of FIG. 3, an interfacial boundary is not established between the waveguiding substrate (312) and the first region (306) and the second region (310) of the optical fibers (306).

In other embodiments, however, the first and/or second regions of an optical fiber are not continuous with the substrate of the frequency conversion region resulting in an interfacial boundary being established between the substrate and the first region and/or second region of the optical fiber.

The waveguiding substrate (312) in the embodiment of FIG. 3 is also continuous between the optical fibers (306). As described herein, a photovoltaic apparatus (317) is positioned at one end of the waveguiding substrate (312).

As illustrated in FIG. 3, the optical fibers (306) are unobstructed at ends (320) to permit the transmission of light (322) from a light source, such as the sun, down the longitudinal axis of the optical fibers (306) for interaction with the photosensitive organic layers of the first (308) and/or second regions (310) of the optical fibers (306). In some embodiments, microlenses (not shown) are positioned over the unobstructed ends (320). In the embodiment of FIG. 3, the opposing ends (326) of the optical fibers (306) comprise a reflector (324) for reflecting any light (322) not absorbed by the photosensitive organic layers of the first (308) and/or second (310) regions. Reflecting non-absorbed light (322) can provide one or more additional opportunities for the light (322) to interact with a photosensitive layer of the first (308) and/or second region (310) of the optical fiber. In some embodiments, a reflector comprises a hemispherical reflector.

Additionally, in some embodiments of a photoactive apparatus, light received at one end of a first photovoltaic cell can be transferred across the frequency conversion region to an opposing end of a second photovoltaic cell. As illustrated in FIG. 3, a portion of light (322) propagating along the first region of photovoltaic cell (302) is transferred across the frequency conversion region (312) into the second region (310) of photovoltaic cell (303).

In some embodiments, a fiber photovoltaic device described herein displays a fill factor greater than 0.2. In some embodiments, a fiber photovoltaic device displays a fill factor greater than 0.3 or 0.4. A fiber photovoltaic device, in some embodiments, displays a fill factor greater than 0.5.

In some embodiments, a fiber photovoltaic device described herein displays conversion efficiency, $\eta_p$, greater than about 6%. A fiber photovoltaic device described herein, in some embodiments, demonstrates a conversion efficiency greater than about 10% or greater than about 15%. In another embodiment, a fiber photovoltaic device described herein can display a conversion efficiency greater than about 23% or greater than about 25%. In a further embodiment, a fiber photovoltaic device described herein can display a conversion efficiency greater than 35%.

In another aspect, the present invention provides methods of making a photovoltaic apparatus. In some embodiments, a method of making a photovoltaic apparatus comprises providing an optical fiber core comprising a first region and a second region and a frequency conversion region described herein disposed between the first region and the second region, disposing a radiation transmissive electrode on a surface of the first region of the optical fiber core, disposing at least one photosensitive organic layer in electrical communication with the radiation transmissive electrode of the first region and disposing an electrode in electrical communication with the photosensitive organic layer of the first region.

In some embodiments, disposing a radiation transmissive electrode is disposed on a surface of the first region of the optical fiber comprises sputtering or dip coating a radiation transmissive conductive oxide onto the surface of the first region. In some embodiments, disposing a photosensitive organic layer in electrical communication with the radiation transmissive electrode of the first region comprises depositing the organic layer on the radiation transmissive electrode by dip coating, spin coating, vapor deposition or vacuum thermal annealing. Disposing an electrode surrounding the photosensitive organic layer of the first region of the optical fiber, in some embodiments, comprises depositing the electrode on the photosensitive organic layer by vapor phase deposition, spin coating or dip coating.

In some embodiments, a method of making a photovoltaic apparatus further comprises disposing a radiation transmissive electrode on a surface of the second region of the optical fiber core, disposing at least one photosensitive organic layer in electrical communication with the radiation transmissive electrode of the second region and disposing an electrode in electrical communication with the photosensitive organic layer of the second region. In some embodiments, the radiation transmissive electrode, photosensitive organic layer and electrode of the second region of the optical fiber can be deposited in a manner consistent with that described for the same of the first region of the optical fiber.

Methods of producing a photovoltaic apparatus, in some embodiments, further comprise annealing the photosensitive organic layer of the first region or the second region of the optical fiber. In some embodiments wherein a photosensitive organic layer comprises a composite material comprising a polymeric phase and a nanoparticle phase, annealing the photosensitive organic layer can produce higher degrees of crystallinity in one or both the polymeric and nanoparticle phases as well as result in greater dispersion of the nanoparticle phase in the polymeric phase. Nanoparticle phases comprising fullerenes, single-walled carbon nanotubes, multi-walled carbon nanotubes or mixtures thereof can form nanowhiskers in the polymeric phase as a result of annealing. Annealing a photosensitive organic layer of the first and/or second region, according to some embodiments, comprises heating the organic layer at a temperature ranging from about 80° C. to about 160° C. for a time period ranging from about 1 minute to about 30 minutes. In some embodiments, a photosensitive organic layer of the first and/or second region is annealed for a time period ranging from about 5 minutes to about 10 minutes.

In some embodiments of making a photovoltaic apparatus, one or more upconverter and/or downconverter materials are incorporated onto and/or into a substrate of the frequency conversion region. In some embodiments, one or more upconverter and/or downconveter materials are coated onto a substrate surface of the frequency conversion region. In some embodiments, one or more upconverter and/or downconverter material are disposed within a substrate of the frequency conversion region.

In some embodiments, an optical fiber comprising a first region and a second region and a frequency conversion region disposed between the first region and the second region is provided as a monolithic or continuous structure. In some embodiments, for example, the optical fiber comprising a first region and a second region and a frequency conversion region disposed between the first region and the second region is molded or extruded as a continuous structure. In some embodiments, the optical fiber comprising a first region and a second region and a frequency conversion region disposed between the first region and the second region is stamped from a monolithic or continuous material such as a planar polymeric material such as a polyacrylate or polystyrene. In some embodiments, one or more upconverter and/or downconverter materials are incorporated into a melt which can be molded or extruded into the continuous structure. In some embodiments, one or more upconverter and/or downconverter materials are incorporated into a monolithic material from which the first and/or second regions of an optical fiber are stamped.

In a further aspect, the present invention provides methods of converting photonic energy into electrical energy. In some embodiments, a method of converting photonic energy into electrical energy comprises receiving electromagnetic radiation along the optical axis of an optical fiber comprising a first region and a second region separated by a frequency conversion region, transmitting at least a portion of the electromagnetic into a photosensitive organic layer through a radiation transmissive electrode surrounding the first region of the optical fiber, generating excitons in the photosensitive organic layer and separating the excitons into holes and electrons at one or more heterojunctions in the photosensitive organic layer. The electrons, in some embodiments, are removed into an external electrical circuit. In some embodiments, electromagnetic radiation received along the longitudinal axis of an optical fiber comprises visible radiation, ultraviolet radiation, infrared radiation or mixtures thereof.

In some embodiments, a method of converting photonic energy into electrical energy further comprises passing a portion of electromagnetic radiation not transmitted into the photosensitive organic layer surrounding the first region of the optical fiber through the frequency conversion region and changing the frequency of the electromagnetic radiation. In some embodiments, the frequency altered electromagnetic radiation is passed to the second region of the optical fiber, wherein at least a portion of the frequency altered electromagnetic radiation is transmitted into a photosensitive organic layer through a radiation transmissive electrode surrounding the second region of the optical fiber to generate excitons in the photosensitive organic layer. The excitons are subsequently separated at one or more bulk heterojunctions in the photosensitive organic layer.

In some embodiments, transmitting at least a portion of the electromagnetic radiation into the photosensitive organic layer of the first region and/or the second region comprises transmitting the radiation through evanescence fields. In some embodiments, transmitting at least a portion of the electromagnetic radiation into the photosensitive organic layer of the first region and/or the second region comprises scattering the radiation into the organic layer with a scattering agent. Scattering agents, in some embodiments, are disposed within the optical fiber. In some embodiments, scattering agents comprise transition metal nanoparticles. Transition metal nanoparticles, in some embodiments, comprise rods and/or wires. In one embodiment, for example, a transition metal nanorod or nanowire can have a diameter ranging from about 2 nm to about 50 nm.

Some embodiments of the present invention are further illustrated by the following non-limiting example.

EXAMPLE 1

Photoactive Fiber Apparatus

A non-limiting example of a photoactive fiber apparatus described herein is prepared according to the following procedure.

A polystyrene substrate is provided comprising one or more upconversion materials described herein. The one or more upconversion materials are blended into a melt of the polystyrene during substrate formation or otherwise incorporated into or coated onto surfaces of the polystyrene substrate.

A plurality of optical fibers comprising a first region and a second region are stamped from the substrate leaving a portion of the substrate disposed between the first and second regions of the optical fibers. The first region and the second region of the polystyrene optical fibers each have a diameter of 25 µm and a length of 25 µm. The first and second regions of the optical fibers are cleaned, and a radiation transmissive electrode comprising 3,4-polyethylenedioxythiophene (PEDOT) is dip coated onto the surfaces of the first region and the second region of the optical fibers and dried.

Subsequently, a photosensitive organic layer comprising a solution of P3HT (American Dye):PCBM (American Dye) =1:0.8 in chlorobenzene is deposited on the radiation transmissive electrodes of the first region and the second region of the optical fibers. LiF and Al electrodes are then deposited over the photosensitive organic layers of the first and second regions of the optical fibers. LiF and Al are deposited via thermal evaporation at the pressure of $10^{-6}$ Torr.

After preparation, the photoactive fiber apparatus is characterized in terms of current-voltage plots.

Various embodiments of the invention have been described in fulfillment of the various objects of the invention. It should be recognized that these embodiments are merely illustrative of the principles of the invention. Numerous modifications and adaptations thereof will be readily apparent to those skilled in the art without departing from the spirit and scope of the invention.

That which is claimed is:

1. A method of converting photonic energy into electrical energy comprising:
    receiving electromagnetic radiation along the optical axis of an optical fiber comprising a first region and a second region separated by a frequency conversion region comprising a substrate;
    transmitting at least a portion of the electromagnetic radiation into a photosensitive organic layer through a radiation transmissive electrode surrounding the first region of the optical fiber;
    generating excitons in the photosensitive organic layer; and
    separating the excitons into electrons and holes at one or more heterojunctions in the photosensitive organic layer.

2. The method of claim 1 further comprising passing a portion of electromagnetic radiation not transmitted into the photosensitive organic layer surrounding the first region of the optical fiber through the frequency conversion region and changing the frequency of the electromagnetic radiation.

3. The method of claim 2, wherein the frequency of the electromagnetic radiation is increased.

4. The method of claim 2, wherein the frequency of the electromagnetic radiation is decreased.

5. The method of claim 2 further comprising:
    passing the frequency altered electromagnetic radiation to the second region of the optical fiber;
    transmitting at least a portion of the frequency altered electromagnetic radiation into a photosensitive organic layer through a radiation transmissive electrode surrounding the second region of the optical fiber;
    generating excitons in the photosensitive organic layer; and
    separating the excitons into electrons and holes at one or more heterojunctions in the photosensitive organic layer.

6. The method of claim 1, wherein the portion of the electromagnetic radiation transmitted into the photosensitive organic layer surrounding the first region of the optical fiber comprises visible electromagnetic radiation.

7. The method of claim 2, wherein the portion of electromagnetic radiation passed through the frequency conversion region comprises infrared radiation.

8. The method of claim 5, wherein the frequency altered radiation comprises visible radiation.

9. The method of claim 1, wherein the substrate is arranged normal to the longitudinal axis of the optical fiber.

10. The method of claim 9, wherein the frequency conversion region is continuous with at least one of the first region of the optical fiber and the second region of the optical fiber.

11. The method of claim 1, wherein the frequency conversion region comprises a waveguide having an optical axis arranged normal to the optical axis of the optical fiber.

12. The method of claim 5, wherein the radiation transmissive electrode surrounding the first region and the radiation transmissive electrode surrounding the second region comprise a radiation transmissive conducting oxide.

13. The method of claim 5, wherein the photosensitive organic layer surrounding the first region and the photosensitive organic layer surrounding the second region comprise a photoactive region comprising at least one bulk heterojunction between a donor material and an acceptor material.

14. The method of claim 13, wherein the donor material comprises a polymeric phase, and the acceptor material comprises a nanoparticle phase.

15. The method of claim 14, wherein the polymeric phase comprises a conjugated polymer.

16. The method of claim 15, wherein the polymeric phase of the donor material of the photosensitive organic layer surrounding the first region and the polymeric phase of the donor material of the photosensitive organic layer surrounding the second region are independently selected from the group consisting of poly(3-hexylthiophene), poly(3-octylthiophene) or mixtures thereof.

17. The method of claim 14, wherein the nanoparticle phase of the acceptor material of the photosensitive organic layer surrounding the first region and the nanoparticle phase of the acceptor material of the photosensitive organic layer surrounding the second region are independently selected from the group consisting of fullerenes, carbon nanotubes or mixtures thereof.

18. The method of claim 1, wherein at least one of the first region of the optical fiber and the second region of the optical fiber further comprises at least one exciton blocking layer.

19. The method of claim 18, wherein the at least one exciton blocking layer comprises a polymeric composite.

20. The method of claim 19, wherein the polymeric composite comprises a plurality of nanotubes or fullerenes dispersed in poly(3,4-ethylenedioxythiophene) or in poly(vinylidene fluoride).

21. The method of claim 9, wherein the substrate of the frequency conversion region comprises at least one upconversion material.

22. The method of claim 21, wherein the at least one upconversion material comprises a Lanthanide series element or 4-(dimethylamino)cinnamonitrile (cis and trans), trans-4-[4-(dimethylamino)styryl]-1-methylpyridinium iodide, 4-[4-(dimethylamino)styryl]pyridine, 4-(diethylamino)benzaldehyde diphenylhydrazone, trans-4-[4-(dimethylamino)styryl]-1-methylpyridinium p-toluenesulfonate, 2-[ethyl[4-

[2-(4-nitrophenyl)etheny]phenyl]amino]ethanol, 4-dimethylamino-4'-nitrostilbene, Disperse Orange 25, Disperse Orange 3 or Disperse Red 1 or mixtures thereof.

23. The method of claim 11, wherein a photovoltaic apparatus is positioned at an edge of the waveguide.

24. The method of claim 23, wherein the photovoltaic apparatus comprises an inorganic photosensitive material.

* * * * *